(12) United States Patent
Chang

(10) Patent No.: US 7,449,875 B2
(45) Date of Patent: Nov. 11, 2008

(54) DEVICE FOR AUTOMATIC DETECTION OF BATTERY POLARITY

(75) Inventor: I-Chang Chang, Sijhih (TW)

(73) Assignee: Jye Chuang Electronic Co., Ltd., Taipei County (TW)

( * ) Notice: Subject to any disclaimer, the term of this patent is extended or adjusted under 35 U.S.C. 154(b) by 47 days.

(21) Appl. No.: 11/526,071

(22) Filed: Sep. 25, 2006

(65) Prior Publication Data

US 2008/0074097 A1    Mar. 27, 2008

(51) Int. Cl.
G01R 19/00 (2006.01)
G01R 31/02 (2006.01)
G01R 19/14 (2006.01)
H02J 7/00 (2006.01)

(52) U.S. Cl. .............. 324/76.11; 324/72.5; 324/133; 320/110; 320/165

(58) Field of Classification Search ............. 324/72.5, 324/76.11, 133, 426; 320/106, 110, 112, 320/165

See application file for complete search history.

(56) References Cited

U.S. PATENT DOCUMENTS

| | | | | |
|---|---|---|---|---|
| 4,876,496 A | * | 10/1989 | Duncan | 320/164 |
| 5,072,167 A | * | 12/1991 | Zias | 320/165 |
| 5,371,455 A | * | 12/1994 | Chen | 320/165 |
| 5,486,750 A | * | 1/1996 | Walborn et al. | 320/159 |
| 5,729,115 A | * | 3/1998 | Wakefield | 320/110 |
| 5,742,149 A | * | 4/1998 | Simpson | 320/113 |
| 5,780,991 A | * | 7/1998 | Brake et al. | 320/112 |
| 5,965,998 A | * | 10/1999 | Whiting et al. | 320/165 |
| 7,005,832 B2 | * | 2/2006 | Nordlof | 320/121 |
| 7,058,484 B1 | * | 6/2006 | Potega | 324/426 |
| 2006/0255763 A1 | * | 11/2006 | Lung Tong | 320/110 |
| 2007/0018609 A1 | * | 1/2007 | Yen | 320/107 |

* cited by examiner

Primary Examiner—Timothy J Dole
(74) Attorney, Agent, or Firm—Troxell Law Office, PLLC

(57) ABSTRACT

The present invention provides a device for automatic detection of battery polarity, wherein a detector circuit is structured from detector terminals, detector units, positive voltage electrical connecting units and negative voltage electrical connecting units. Operational procedure involves first connecting battery electrical conducting units with the detector terminals of the detector circuit, when the detector terminals are connected to positive poles of the battery, then one set or more than one set of the detector units of the detector circuit detect positive voltage, which actuate an electrical connection with the positive voltage electrical connecting units, thus connecting positive poles of the detector device to the detector terminals and connecting to positive poles of the battery, at the same one set or more than one set of the detector units determine negative voltage and actuate a connection with the negative voltage electrical connecting units, thereby forming a complete circuit.

5 Claims, 5 Drawing Sheets

DEVICE FOR AUTOMATIC DETECTION OF BATTERY POLARITY

BACKGROUND OF THE INVENTION (a) Field of the Invention

The present invention relates to a device for automatic detection of battery polarity, and more particularly to a device wherein positive terminals and negative terminals of battery electrical connecting units are respectively connected to detector terminals of a detector circuit.

(b) Description of the Prior Art

FIG. 1 shows a charger A of prior art, wherein disposition of electrical contact points A1 of the charger A is fixed, and positive contact points and negative contact points extending from a circuit located interior of the charger A are fixed contact points. If a battery is disposed into the charger A having a dissimilar configuration of positive and negative contact points, then the charger A is unable to implement charging of the battery, even to the extent of posing a threat of damaging the battery.

Furthermore, because of different sizes of batteries and position and spacing of electrical contact points of chargers are all unequal, thus, the single charger A is only able to singly accommodate the corresponding battery A2, and is unable to achieve accommodating diverse batteries to implement charging thereof.

SUMMARY OF THE INVENTION

The present invention provides a device for automatic detection of battery polarity, and more particularly to a device wherein positive terminals and negative terminals of battery electrical connecting units are respectively connected to detector terminals of a detector circuit, whereupon detector devices of the detector circuit actuate a connection with positive voltage electrical connecting units and negative voltage electrical connecting units, thereby enabling the detector circuit to form a complete circuit.

To enable a further understanding of said objectives and the technological methods of the invention herein, brief description of the drawings is provided below followed by detailed description of the preferred embodiments.

DETAILED DESCRIPTION OF THE PREFERRED EMBODIMENTS

Figure 1:
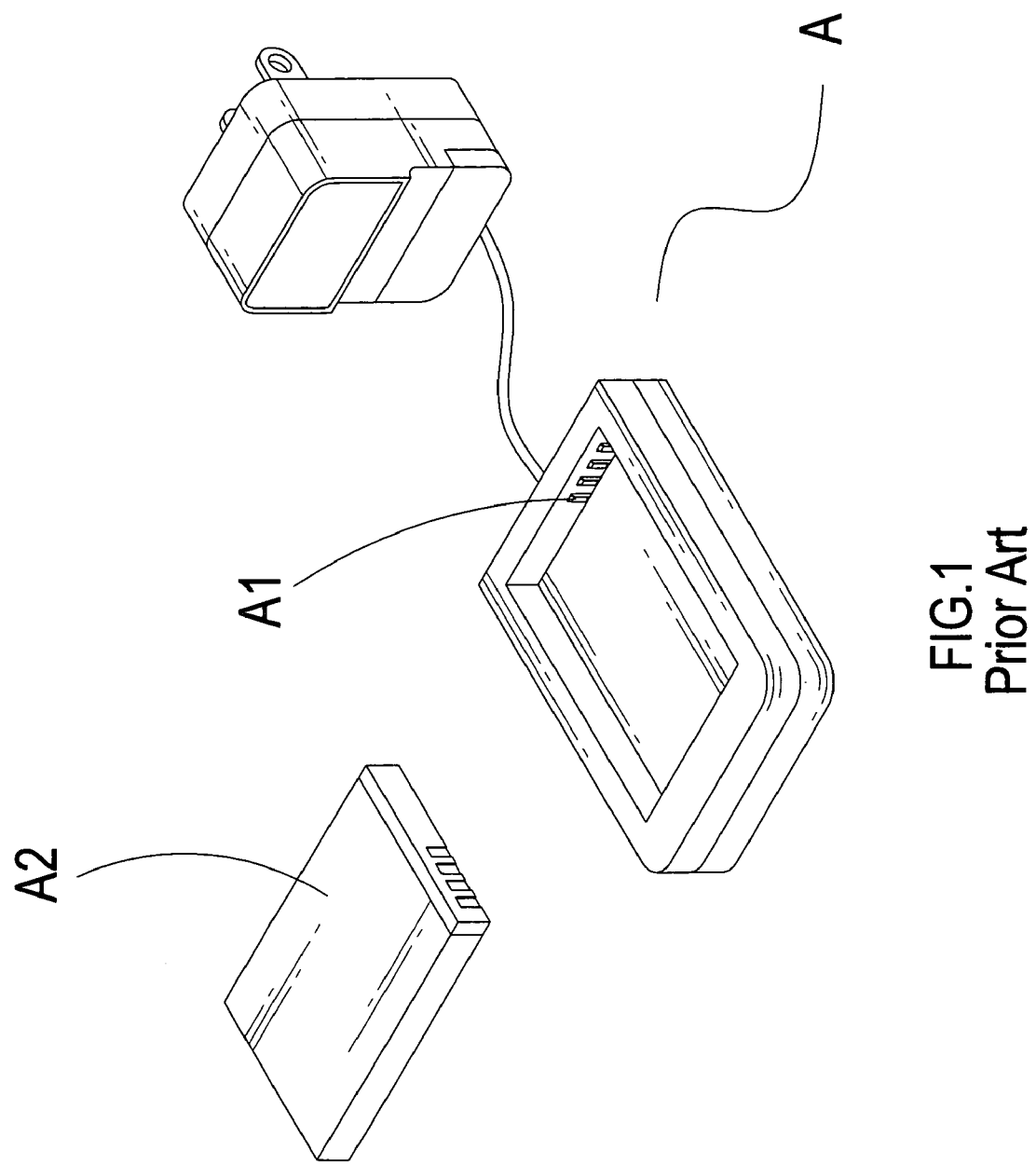
FIG. 1 shows an elevational view of prior art.
Figure 2:
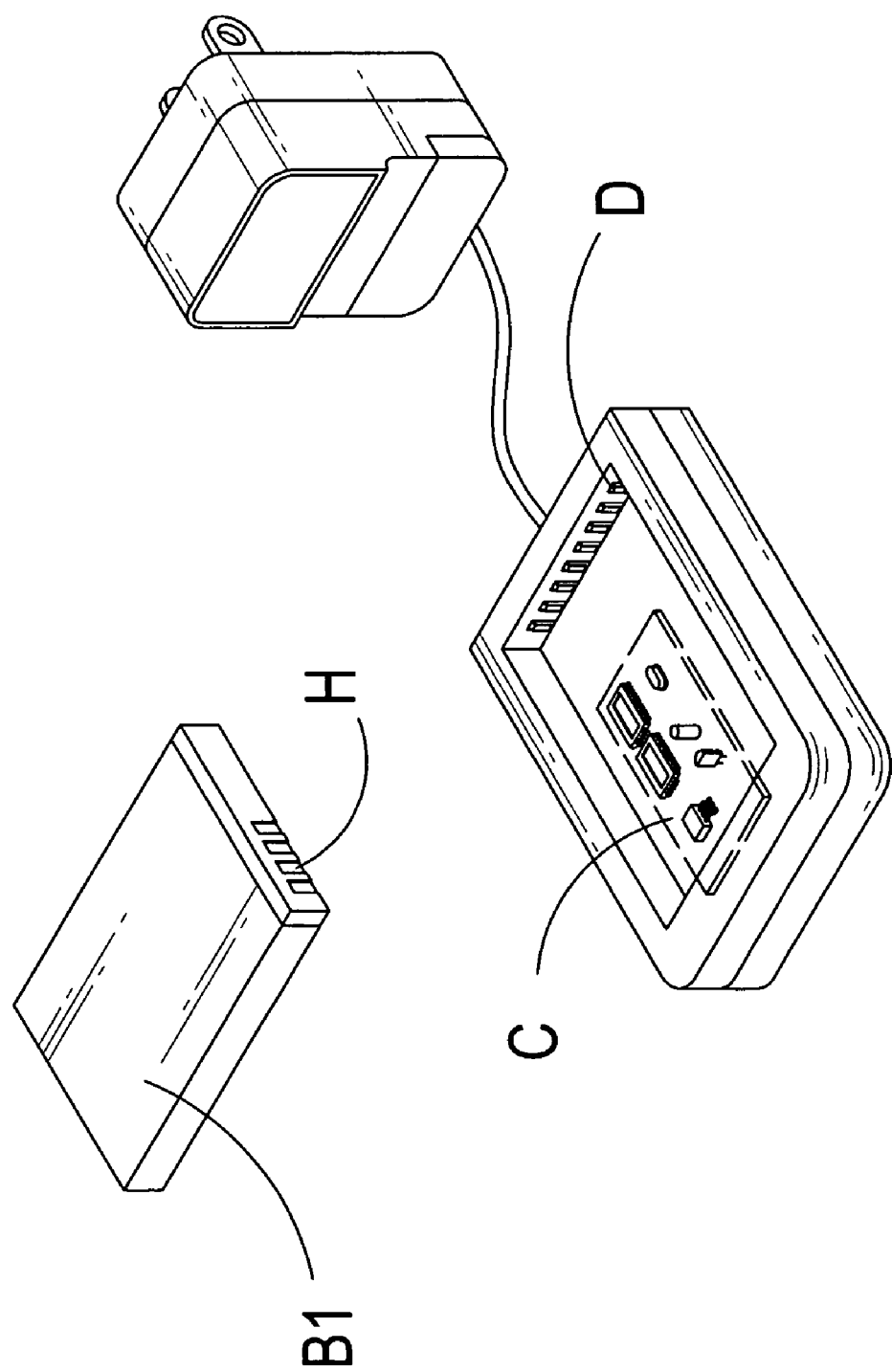
FIG. 2 shows an elevational view according to the present invention.
Figure 3:
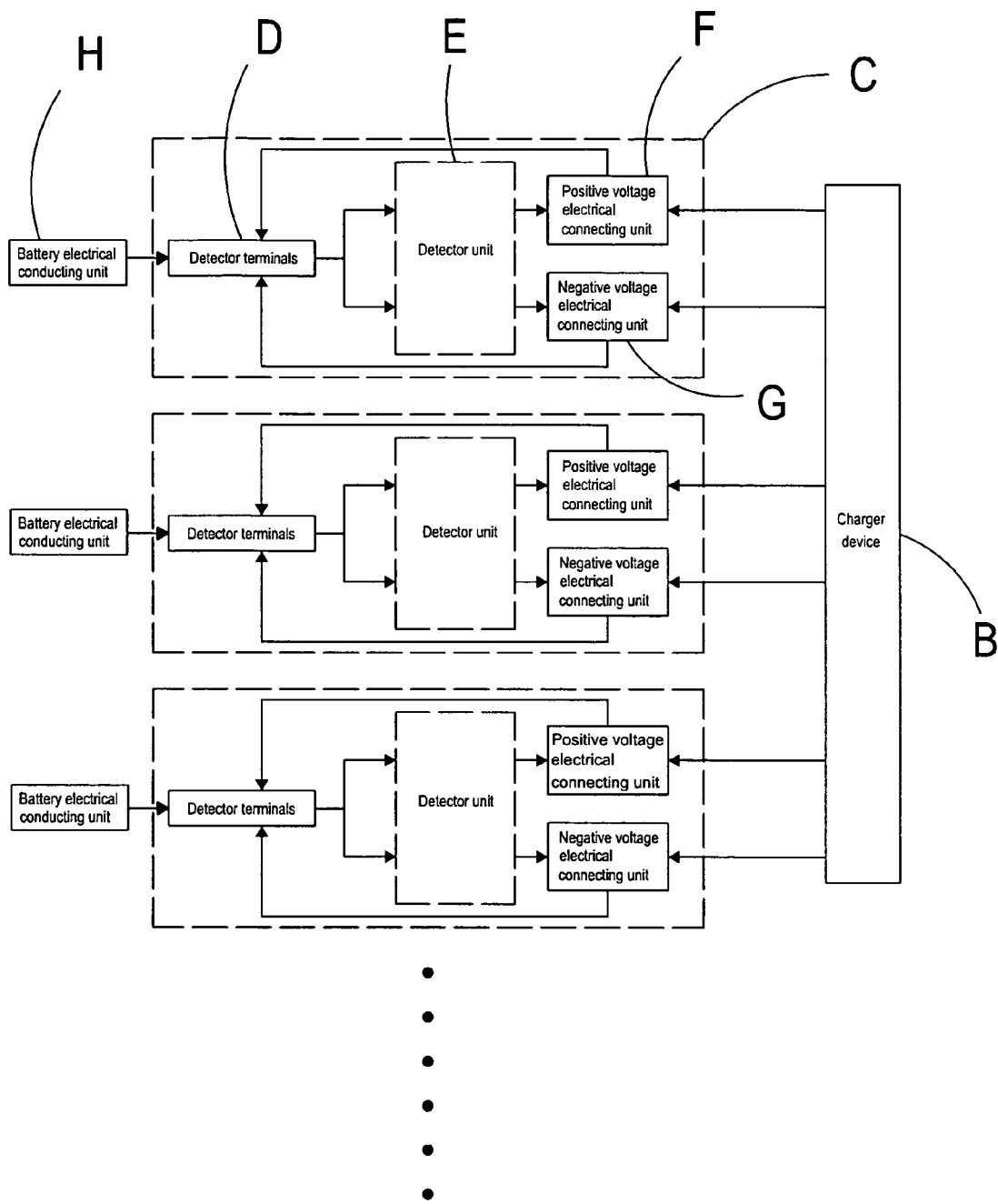
FIG. 3 shows a system block diagram according to the present invention.

The present invention provides a device for automatic detection of battery polarity. Referring to FIGS. 2 and 3, wherein a detector circuit C is structured to comprise detector terminals D, detector units E, positive voltage electrical connecting units F and negative voltage electrical connecting units G.

Operational procedure for using the present invention involves first connecting battery electrical conducting units H with the detector terminals D of the detector circuit C. When the detector terminals D are connected to positive poles of a battery B1, then one set or more than one set of detector units E detect positive voltage, which actuate an electrical connection with the positive voltage electrical connecting units F, and positive poles of a charger device B are presented to the detector terminals D and electrically connected to the positive poles of the battery B1. Correspondingly, when the other detector terminals D are connected to the battery B1, the remaining detector units E determine that they are negative voltage and actuate the negative voltage electrical connecting units G, then negative poles of the charger device B are presented to the detector terminals D and electrically connected to the negative poles of the battery B1, thereby forming a complete charge circuit that enables the charger device B to commence charging the battery B1.

Figure 4:
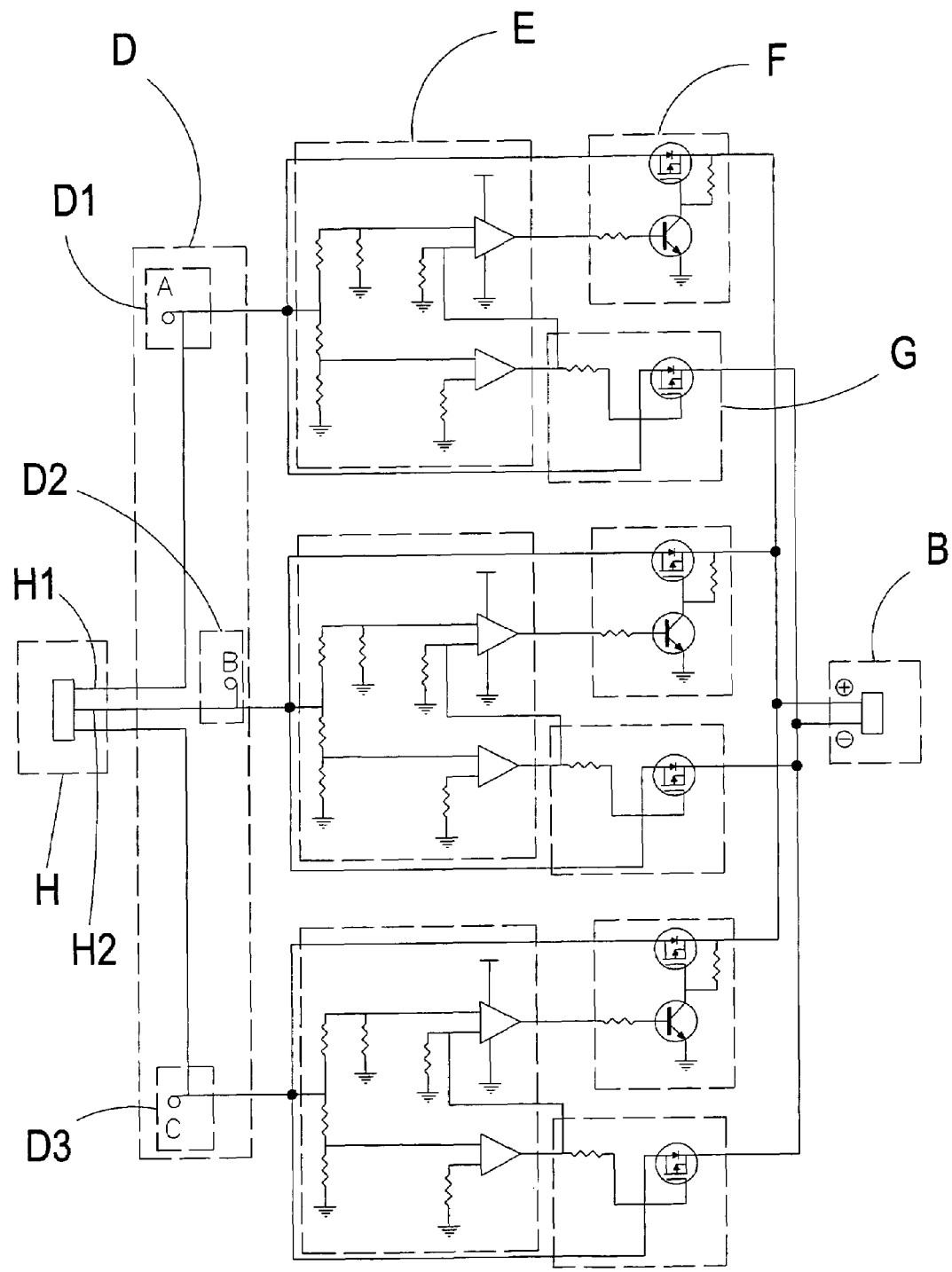
FIG. 4 shows a circuit diagram according to the present invention.
Figure 5:
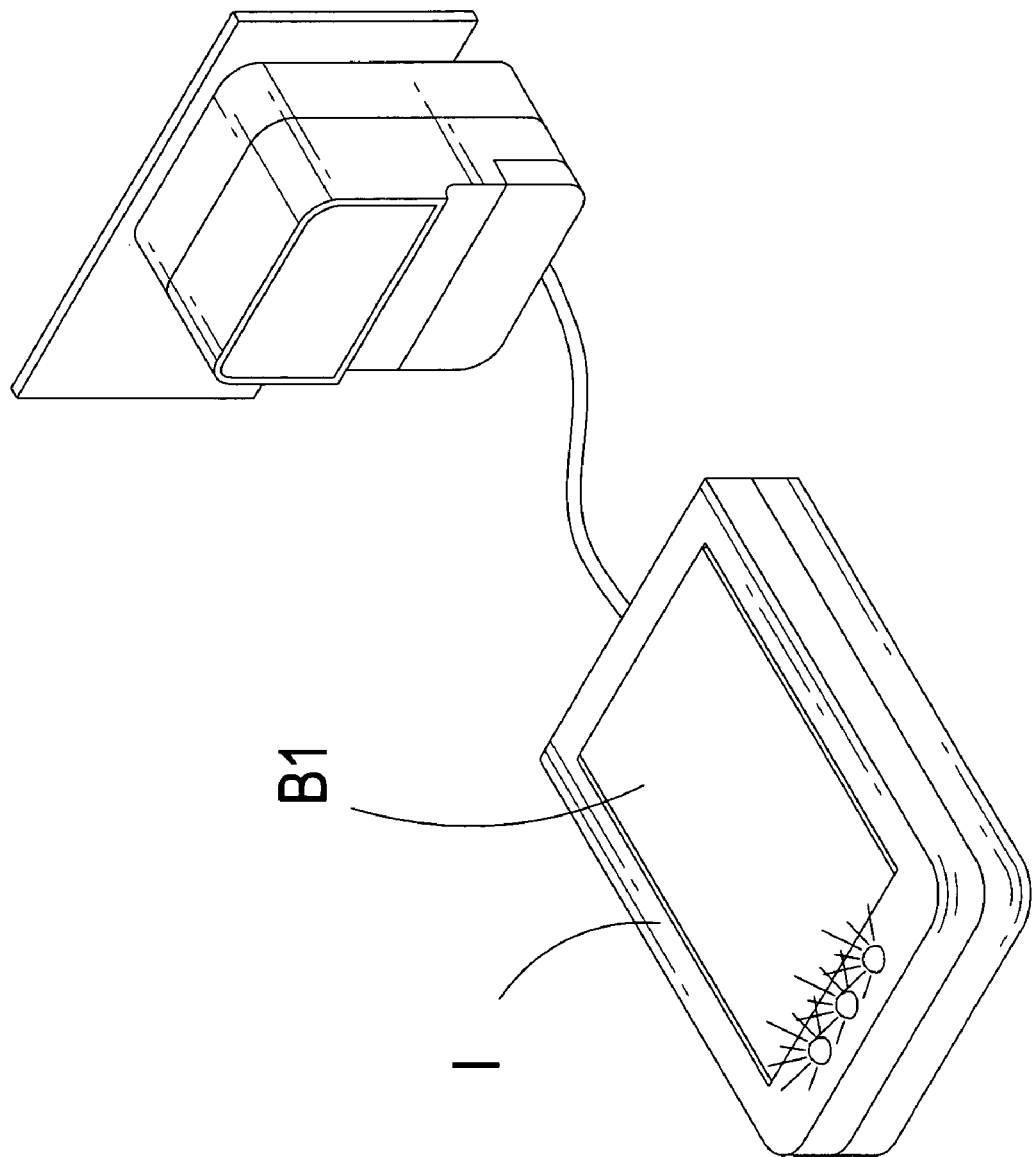
FIG. 5 shows an elevational view of a first embodiment according to the present invention.

Referring to FIGS. 3, 4 and 5, which show embodiments of the device for automatic detection of battery polarity of the present invention, wherein when the battery electrical conducting units H are connected to the detector terminals D of the detector circuit C, hen positive terminals H1 and negative terminals H2 of the battery electric conducting units H need only electrical connect to any two terminals of the detector terminals D to enable the detector circuit C to form a complete charge circuit.

A charger I uses two or more than two detector terminals D to enable accommodating batteries B1 of different sizes and match different positions and spacings of the battery electrical conducting units H, thereby achieving electrical connections with all charge contact points of the battery B1, and enabling the charger I to accommodate the different types of battery B1 and correctly locate the positive terminals H1 and the negative terminals H2 of the battery electrical connecting units H.

If detector terminal A points D1 are electrically connected to the positive terminals H1 of the battery electrical conducting units H, then positive potential passes through the detector units E, which detect and output positive voltage that enables electrical connecting with the positive voltage electrical connecting units F, thus, the positive voltage electrical connecting units F enable electrically connecting positive poles of the charger device B to the detector terminal A points D1, thereby enabling the positive poles of the charger device B to connect to the positive terminals H1 of the battery electrical conducting units H. Correspondingly, detector terminal B points D2 are electrically connected to the negative terminals H2 of the battery electrical conducting units H1, and negative potential passes through the detector units E, which detect and output negative voltage that enables electrical connecting with the negative voltage electrical connecting units G, thus, the negative voltage electrical connecting units G enable electrically connecting negative poles of the charger device B to the detector terminal B points D2, thereby enabling the negative poles of the charger device B to connect to the negative terminals H2 of the battery electrical conducting units H, and enabling the charger device B to commence charging of the battery B1.

Conversely, if the detector terminal A points D1 are electrically connected to the negative terminals H2 of the battery electrical conducting units H1, then negative potential passes through the detector units E, which detect and output negative voltage that enables electrical connecting with the negative voltage electrical connecting units G, thus, the negative voltage electrical connecting units G enable electrically connecting the negative poles of the charger device B to the detector terminal A points D1, thereby enabling the negative poles of the charger device B to connect to the negative terminals H2 of the battery electrical conducting units H. Correspondingly, detector terminal B points D2 are electrically connected to the positive terminals H1 of the battery electrical conducting units H, and positive potential passes through the detector units E, which detect and output positive voltage that enables electrical connecting with the positive voltage electrical connecting units F, thus, the positive voltage electrical connecting units F enable electrically connecting the positive poles of the charger device B to the detector terminal B points D2, thereby enabling the positive poles of the charger device B to connect to the positive terminals H1 of the battery electrical conducting units H, and enabling the charger device B to commence charging of the battery B1.

If detector terminal C points D3 are not electrically connected to the positive terminals H1 nor to the negative terminals H2 of the battery electrical conducting units H, then the detector units E detect and output zero voltage, and the zero voltage is unable is effect electrical connection with the positive voltage electrical connecting units F and the negative voltage electrical connecting units G, thus, a charge circuit is unable to be formed.

In order to better explicitly disclose advancement and practicability of the present invention, advantages of the present invention are described hereinafter:

1. When connecting pins of a battery are electrically connected to the charger I, the charger I is able to automatically detect polarity of the battery.

2. Power supply status of connecting pins of the charger I is determined by electrical connecting positions of the battery.

3. Only requires electrical connection of the connecting pins of the charger, and is not limited by size of the battery or position and spacing of contact points of the battery.

4. Substantially increases compatibility of the charger I with batteries.

5. Provided with industrial competitiveness.

6. Provided with commercial utility value.

7. Provided with originality.

In conclusion, practicability and advancement of the present invention clearly comply with essential elements as required for a new patent application. Accordingly, a new patent application is proposed herein.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A device for automatic detection of battery polarity, comprising a plurality of detector terminals, a plurality of detector units, a plurality of positive voltage electrical connecting units and a plurality of negative voltage electrical connecting units, wherein operational procedure involves first connecting battery electrical conducting units with the plurality of detector terminals, when the detector terminals are connected to positive poles of the battery, then one set or more than one set of the detector units detect positive voltage, which actuate an electrical connection with the positive voltage electrical connecting units, at the same time one set or more than one set of the detector units determine negative voltage and actuate the negative voltage electrical connecting units, thereby forming a complete circuit and enabling current to flow from the positive voltage electrical connecting units, wherein the plurality of detector terminals is more than two and a detector circuitry of the detector units being configured so that connecting the battery to any two of the plurality of detector terminals enables the detector circuitry to form the complete circuit.

2. The device for automatic detection of battery polarity according to claim 1, wherein control circuit members of the detector units are transistors, comparators, optical couplers, SCR (semiconductor controlled rectifiers), MOS (metal oxide semiconductors) and related equivalent members.

3. The device for automatic detection of battery polarity according to claim 1, wherein the positive voltage electrical connecting units and the negative voltage electrical connecting units are MOS (metal oxide semiconductors), relays, transistors, SCR (semiconductor controlled rectifiers) and semiconductor members having related functionality.

4. The device for automatic detection of battery polarity according to claim 1, wherein component members, including the plurality of sets of detector units, the plurality of positive voltage electrical connecting units, the plurality of negative voltage electrical connecting units, are integrated to form a module and an integrated circuit (IC), thereby effectively improving connectivity and operation of related circuits.

5. The device for automatic detection of battery polarity according to claim 1, wherein the device is a charger device, a discharge device and a device for measuring voltage, current, internal resistance or related properties of a battery.

* * * * *